(12) United States Patent
Morimoto et al.

(10) Patent No.: US 7,848,455 B2
(45) Date of Patent: Dec. 7, 2010

(54) TRANSMISSION CIRCUIT COMPRISING MULTISTAGE AMPLIFIER, AND COMMUNICATION DEVICE

(75) Inventors: Shigeru Morimoto, Osaka (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 572 days.

(21) Appl. No.: 12/017,885

(22) Filed: Jan. 22, 2008

(65) Prior Publication Data
US 2008/0175335 A1  Jul. 24, 2008

(30) Foreign Application Priority Data
Jan. 22, 2007  (JP)  ............... 2007-011691

(51) Int. Cl.
*H03C 3/00*  (2006.01)

(52) U.S. Cl. .................................... 375/302

(58) Field of Classification Search ......... 375/295–297, 375/300, 302; 455/108, 110, 127.1, 114.1, 455/91, 114.2, 127.2, 126, 63.1, 67.13, 501, 455/570
See application file for complete search history.

(56) References Cited

U.S. PATENT DOCUMENTS

| | | | |
|---|---|---|---|
| 6,242,975 B1 | 6/2001 | Eidson et al. | |
| 6,998,919 B2 | 2/2006 | Gamero et al. | |
| 7,496,334 B2 * | 2/2009 | Saito | ............ 455/114.3 |
| 2004/0263245 A1 * | 12/2004 | Winter et al. | ............ 330/10 |
| 2006/0159198 A1 * | 7/2006 | Morimoto et al. | ............ 375/297 |

* cited by examiner

*Primary Examiner*—Kevin M Burd
(74) *Attorney, Agent, or Firm*—Wenderoth, Lind & Ponack, L.L.P.

(57) ABSTRACT

Provided is a transmission circuit which is capable of compensating for an offset voltage and a sensitivity characteristic of a PA, and operating with low distortion and high efficiency. A regulator 18 supplies, to a PA 201, a voltage which is controlled in accordance with an amplitude signal to which a first offset value has been added. A regulator 19 supplies, to a PA 202, a voltage which is controlled in accordance with an amplitude signal to which a second offset value has been added. The PA 201 amplifies, in accordance with the voltage supplied from the regulator 18, a phase-modulated signal outputted from a phase modulator 13. The PA 202 amplifies, in accordance with the voltage supplied from the regulator 19, an output signal of the PA 201. A digital block 11 controls the first and second offset values in accordance with temperature information T measured by a temperature measuring section 21.

9 Claims, 12 Drawing Sheets

FIG. 2A

| TEMPERATURE INFORMATION T | Voffset | X |
|---|---|---|
| t1 | x11 | x21 |
| t2 | x12 | x22 |
| t3 | x13 | x23 |
| t4 | x14 | x24 |
| ⋮ | ⋮ | ⋮ |

FIG. 2B

| COEFFICIENT 1 | COEFFICIENT 2 |
|---|---|
| a1 | b1 |

FIG. 2C

| OUTPUT POWER OF POWER ADJUSTING SECTION | COEFFICIENT 1 | COEFFICIENT 2 |
|---|---|---|
| =>-10dBm | a1 | b1 |
| =<-11dBm | a2 | b2 |

Vcc2-Vout CHARACTERISTIC

−25degC: Voffset2=Voffset1=0.6mV/degC × −50degC=−30mV
+25degC: Voffset2=Voffset1=+0mV
+75degC: Voffset2=Voffset1=0.6mV/degC × +50degC=+30mV
※50degC=+75degC−25degC Vcc2-Vout CHARACTERISTIC -25degC: Voffset2=0.6mV/degC × -50degC=-30mV
: Voffset1=(0.6mV/degC+0.1mV/degC) × -50degC=-35mV
+25degC: Voffset2=Voffset1=+0mV
+75degC: Voffset2=0.6mV/degC × +50degC=+30mV
: Voffset1=(0.6mV/degC+0.1mV/degC) × +50degC=+35mV
※50degC=+75degC-25degC Vdac-Vout CHARACTERISTIC VARIATION AFTER COMPENSATION IS MINOR, AND DISTORTION DETERIORATION HARDLY OCCURS

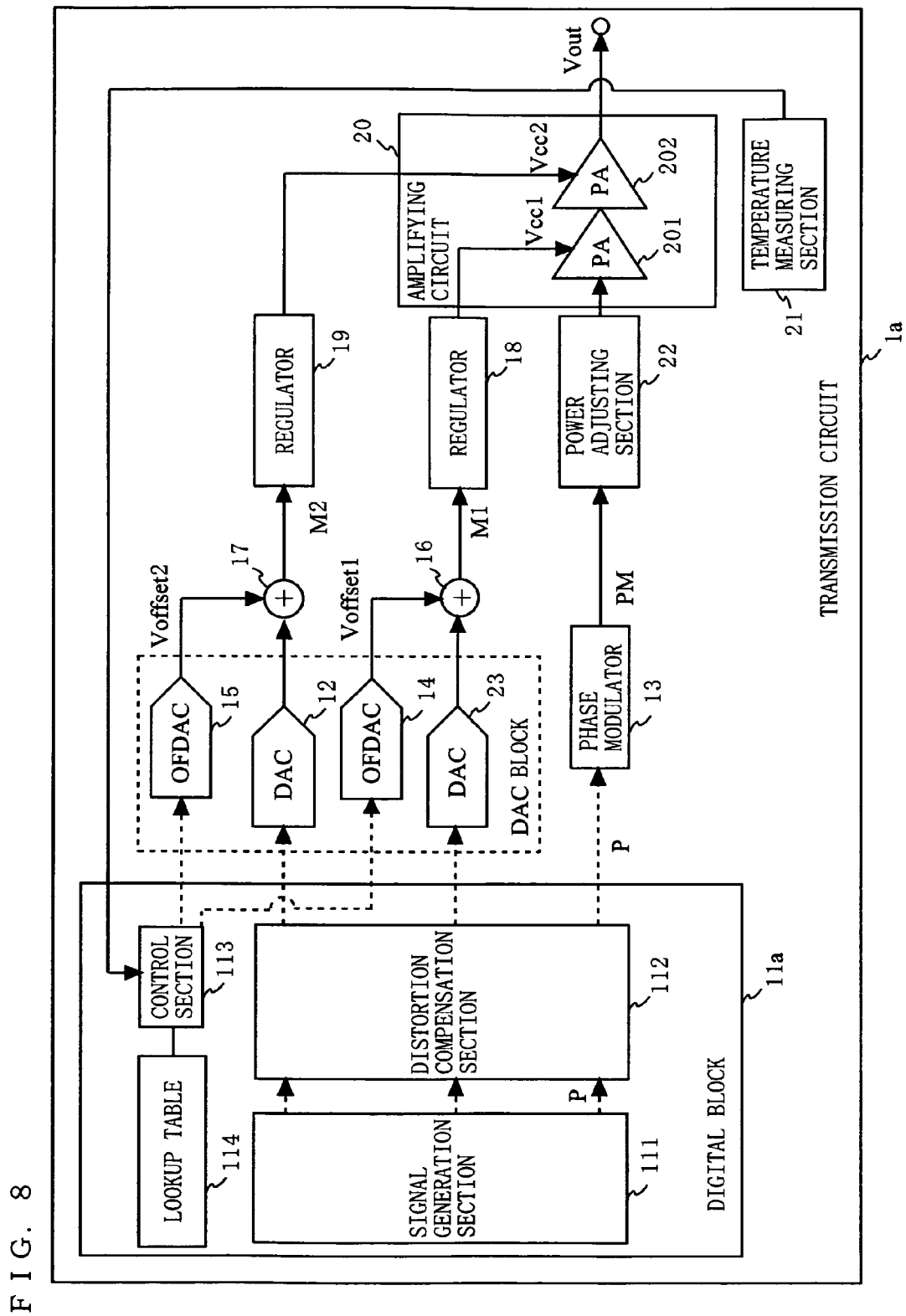
F I G. 8

F I G. 9
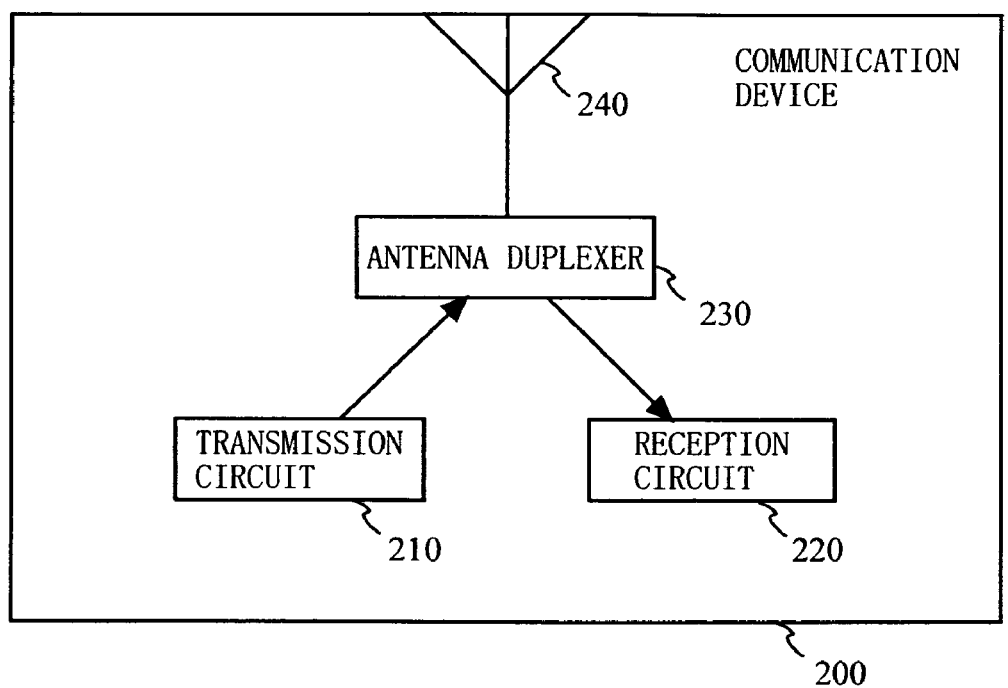

TRANSMISSION CIRCUIT COMPRISING MULTISTAGE AMPLIFIER, AND COMMUNICATION DEVICE

BACKGROUND OF THE INVENTION

1. Field of the Invention

The present invention relates to a transmission circuit comprising a multistage amplifier, which transmission circuit is used in communication devices such as mobile phones and wireless LAN devices. The present invention particularly relates to a transmission circuit comprising a multistage amplifier, which transmission circuit is small in size, operates with high efficiency and outputs a transmission signal having high linearity, and also relates to a communication device using the transmission circuit.

2. Description of the Background Art

Communication devices such as mobile phones and wireless LAN devices are required to, regardless of a magnitude of an output power thereof, secure a precision of a transmission signal and operate with low power consumption. A transmission circuit used in such communication devices is small in size, operates with high efficiency and outputs a transmission signal having high linearity. Hereinafter, conventional transmission circuits will be described.

One of the conventional transmission circuits is, for example, a transmission circuit which uses a modulation method such as a quadrature modulation method to generate a transmission signal (hereinafter, referred to as a quadrature modulation circuit). Since the quadrature modulation circuit is well known, a description thereof will be omitted. A conventional transmission circuit, which is smaller in size and operates more efficiently than the quadrature modulation circuit, is, e.g., a transmission circuit 500 shown in FIG. 10. FIG. 10 is a block diagram showing a structure of the conventional transmission circuit 500. As shown in FIG. 10, the conventional transmission circuit 500 comprises a signal generation section 501, a phase modulator 502, a regulator 503, a PA 504 and a power supply terminal 505.

In the conventional transmission circuit 500, the signal generation section 501 generates an amplitude signal M and a phase signal P. The amplitude signal M is inputted to the regulator 503. The regulator 503 is supplied with a DC voltage from the power supply terminal 505. The regulator 503 supplies, to the PA 504, a voltage Vc which is controlled in accordance with the inputted amplitude signal M. Typically, the regulator 503 supplies, to the PA 504, the voltage Vc which is proportional to a magnitude of the inputted amplitude signal M.

The phase signal P generated by the signal generation section 501 is inputted to the phase modulator 502. The phase modulator 502 phase-modulates the phase signal P, thereby outputting a phase-modulated signal PM. The PA 504 amplifies the phase-modulated signal PM by using the voltage Vc supplied from the regulator 503. The signal amplified by the PA 504 is outputted from an output terminal as a transmission signal. Here, an output voltage of the PA 504 is referred to as Vout. Note that, the transmission circuit 500 as described above is referred to as a polar modulation circuit.

However, the conventional transmission circuit 500 can not always output a highly precise transmission signal, depending on an offset characteristic of the PA 504. The offset characteristic of the PA 504 will be described with reference to FIG. 11. FIG. 11 shows an example of a variation in the offset characteristic of the PA 504, the variation corresponding to a temperature of the PA 504. This example shows a relationship between the voltage Vc supplied to the PA 504 and the output voltage Vout. It is assumed here that a magnitude of an input voltage (i.e., a magnitude of the phase-modulated signal PM) is fixed. It is known that an offset voltage of the PA 504 varies in accordance with the temperature of the PA 504 as shown in FIG. 11. In other words, the conventional transmission circuit 500 has a problem that since the offset voltage of the PA 504 is not compensated for in accordance with the temperature, a highly precise transmission signal cannot be always outputted.

U.S. Pat. No. 6,998,919 (hereinafter, referred to as Patent Document 1) discloses a transmission circuit 600 which is capable of compensating for the offset voltage of the PA 504 in accordance with the temperature of the PA 504. FIG. 12 is a block diagram showing an exemplary structure of the conventional transmission circuit 600 disclosed in Patent Document 1. As shown in FIG. 12, the conventional transmission circuit 600 comprises the signal generation section 501, the phase modulator 502, the regulator 503, the PA 504, the power supply terminal 505, a temperature measuring section 601 and an offset compensation section 602. The temperature measuring section 601 measures the temperature of the PA 504. The offset compensation section 602 changes the magnitude of the amplitude signal M in accordance with the temperature of the PA 504 measured by the temperature measuring section 601, thereby compensating for the offset voltage of the PA 504.

However, even if the offset voltage of the PA 504 is compensated for in accordance with the temperature of the PA 504, the conventional transmission circuit 600 cannot always output a highly precise transmission signal. The reason for this is that not only the offset voltage of the PA 504 but also a sensitivity characteristic of the PA 504 varies in accordance with the temperature of the PA 504. FIG. 13 shows an example of a variation in the sensitivity characteristic of the PA 504, the variation corresponding to the temperature of the PA 504. FIG. 13 shows a relationship between the voltage Vc supplied to the PA 504 and the output voltage Vout. Here, the magnitude of the input voltage (i.e., the magnitude of the phase-modulated signal PM) is fixed. As shown in FIG. 13, the sensitivity characteristic of the PA 504 varies in accordance with the temperature of the PA 504. Accordingly, there is a problem that even if the offset voltage of the PA 504 is compensated for, the conventional transmission circuit 600 cannot always output a highly precise transmission signal since the sensitivity characteristic of the PA 504 is not compensated for in accordance with the temperature.

SUMMARY OF THE INVENTION

Therefore, an object of the present invention is to provide a transmission circuit capable of compensating for the offset voltage and sensitivity characteristic of a PA and operating with low distortion and high efficiency, and to provide a communication device using the transmission circuit.

The object of the present invention is directed to a transmission circuit comprising an amplifying circuit including a plurality of power amplifiers. Here, the plurality of power amplifiers includes at least a first power amplifier and a second power amplifier. In order to achieve the above object, the transmission circuit of the present invention comprises: a digital block for generating an amplitude signal and a phase signal, and outputting a first offset value and a second offset value for compensating for offset characteristics of the first and second power amplifiers; a DAC block for converting the amplitude signal into an analogue signal and outputting the analogue signal to the first path and to the second path, and converting the first and second offset values to analogue signals and outputting the analogue signals to the first and second paths, respectively; a first adder for adding the first offset value to the amplitude signal outputted to the first path, and outputting a resultant amplitude signal; a second adder for adding the second offset value to the amplitude signal outputted to the second path, and outputting a resultant amplitude signal; a phase modulator for phase-modulating the phase signal, thereby outputting a phase-modulated signal; a power adjusting section for amplifying or attenuating the phase-modulated signal outputted from the phase modulator; the first power amplifier for amplifying the phase-modulated signal outputted from the power adjusting section; the second power amplifier for amplifying an output signal of the first power amplifier; a first regulator for supplying, to the first power amplifier, a voltage which is controlled in accordance with the amplitude signal outputted from the first adder; a second regulator for supplying, to the second power amplifier, a voltage which is controlled in accordance with the amplitude signal outputted from the second adder; and a temperature measuring section for measuring a temperature of the amplifying circuit as temperature information. The digital block separately controls the first offset value and the second offset value in accordance with the temperature information measured by the temperature measuring section.

Preferably, the digital block includes: a signal generation section for generating the amplitude signal and the phase signal; a distortion compensation section for compensating for distortion of the amplitude signal and the phase signal; a lookup table in which the first offset value and the second offset value are stored; and a control section for reading the first offset value and the second offset value from the lookup table in accordance with the temperature information measured by the temperature measuring section.

Alternatively, the digital block may include: a signal generation section for generating the amplitude signal and the phase signal; a distortion compensation section for compensating for distortion of the amplitude signal and the phase signal; and a control section for calculating the first offset value and the second offset value by using a mathematical function which associates the temperature information measured by the temperature measuring section with the first offset value and the second offset value.

The control section may calculate, as the first offset value, a product obtained by multiplying the temperature information measured by the temperature measuring section by a first coefficient, and calculate, as the second offset value, a sum of the first offset value and a product obtained by multiplying the temperature information measured by the temperature measuring section by a second coefficient.

The control section is able to change the first coefficient and the second coefficient in accordance with an output power of the second power amplifier.

Preferably, the DAC block includes: a DA converter for converting the amplitude signal, which is outputted from the digital block, into an analogue signal, and outputting the analogue signal to the first path and to the second path; a first offset DA converter for converting the first offset value, which is outputted from the digital block, into an analogue signal, and outputting the analogue signal to the first path; and a second offset DA converter for converting the second offset value, which is outputted from the digital block, into an analogue signal, and outputting the analogue signal to the second path.

Alternatively, the DAC block may include: a first DA converter for converting the amplitude signal, which is outputted from the digital block, into an analogue signal, and outputting the analogue signal to the first path; a second DA converter for converting the amplitude signal, which is outputted from the digital block, into an analogue signal, and outputting the analogue signal to the second path; a first offset DA converter for converting the first offset value, which is outputted from the digital block, into an analogue signal, and outputting the analogue signal to the first path; and a second offset DA converter for converting the second offset value, which is outputted from the digital block, into an analogue signal, and outputting the analogue signal to the second path.

The present invention is also directed to a communication device comprising the above-described transmission circuit. The communication device comprises: a transmission circuit for generating a transmission signal; and an antenna for outputting the transmission signal generated by the transmission circuit. The communication device may further comprise: a reception circuit for processing a reception signal received from the antenna; and an antenna duplexer for outputting the transmission signal generated by the transmission circuit to the antenna, and outputting the reception signal received from the antenna to the reception circuit.

As described above, according to the present invention, an offset voltage and a sensitivity characteristic of the amplifying circuit including the first and second power amplifiers can be compensated for by separately controlling the first offset value to be provided to the first power amplifier and the second offset value to be provided to the second power amplifier. This allows the transmission circuit to operate with low distortion and high efficiency.

Further, by using the above-described transmission circuit in the communication device according to the present invention, the communication device can operate with low distortion and high efficiency over a wide output power range.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2A shows an example of offset values stored in a lookup table 114;

FIG. 2B shows an example of coefficients a1 and b1 stored in the lookup table 114;

FIG. 2C shows an example of coefficients a1, a2, b1 and b2 stored in the lookup table 114;

FIG. 8 is a block diagram showing an exemplary structure of a transmission circuit 1a according to the first embodiment of the present invention;

FIG. 9 is a block diagram showing an exemplary structure of a communication device according to a second embodiment of the present invention;

DESCRIPTION OF THE PREFERRED EMBODIMENTS

First Embodiment

Figure 1:
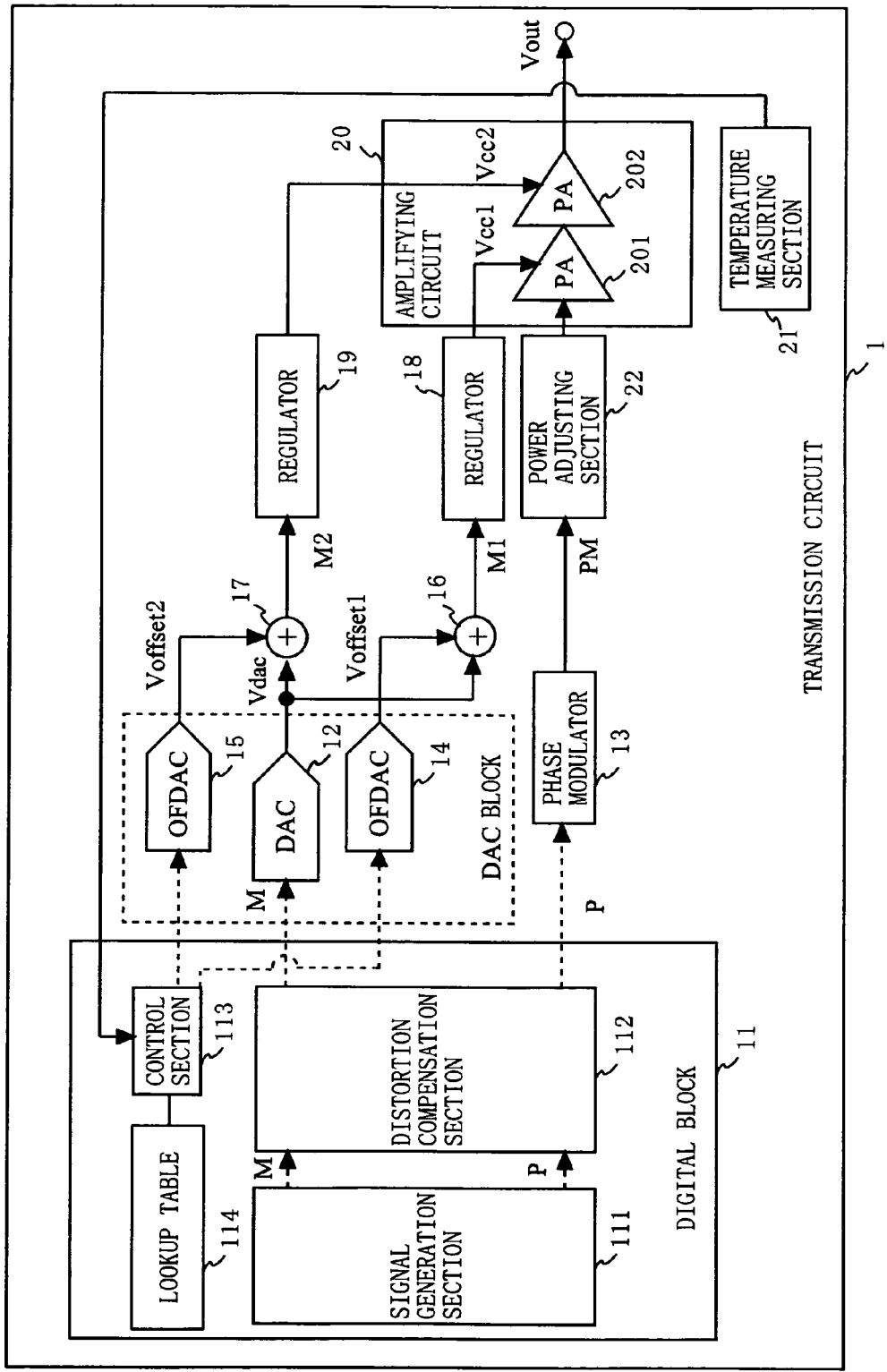
FIG. 1 is a block diagram showing an exemplary structure of a transmission circuit 1 according to a first embodiment of the present invention.

FIG. 1 is a block diagram showing an exemplary structure of a transmission circuit 1 according to a first embodiment of the present invention. As shown in FIG. 1, the transmission circuit 1 comprises a digital block 11, a DA converter (hereinafter, referred to as DAC) 12, a phase modulator 13, offset DA converters (hereinafter, referred to as OFDAC) 14 and 15, adders 16 and 17, regulators 18 and 19, an amplifying circuit 20, a temperature measuring section 21, and a power adjusting section 22. The digital block 11 includes a signal generation section 111, a distortion compensation section 112, a control section 113 and a lookup table 114. The amplifying circuit 20 includes a plurality of power amplifiers (hereinafter, referred to as PA) 201 and 202. Note that, since the DAC 12 and the OFDACs 14 and 15 are components each for converting a digital signal to an analogue signal, these components may be collectively referred to as a DAC block.

In the digital block 11, the signal generation section 111 generates an amplitude signal M and a phase signal P. The amplitude signal M and the phase signal P are, after distortions thereof are compensated for at the distortion compensation section 112, outputted to the DAC 12 and the phase modulator 13, respectively. The temperature measuring section 21 measures a temperature of the PAs 201 and 202 as temperature information T. Based on the temperature information T about the PAs 201 and 202 measured by the temperature measuring section 21, the control section 113 obtains a first offset value Voffset 1 and a second offset value Voffset 2. For example, based on the temperature information T about the PAs 201 and 202 measured by the temperature measuring section 21, the control section 113 reads and obtains the first offset value Voffset 1 and the second offset value Voffset 2 from the lookup table 114. Then, the control section 113 outputs the obtained offset values to the DAC block.

It is assumed in this case that the lookup table 114 prestores offset values for compensating for nonlinearity of the PAs 201 and 202. FIG. 2A shows an example of offset values stored in the lookup table 114. As shown in FIG. 2A, the lookup table 114 stores offset values Voffset and difference values X corresponding to the temperature of the PAs 201 and 202. The first offset value Voffset 1 and the second offset value Voffset 2 can be represented using the following equations (1) and (2):

$$\text{Voffset } 1 = \text{Voffset} + X \quad \text{(equation 1)}$$

$$\text{Voffset } 2 = \text{Voffset} \quad \text{(equation 2)}$$

Here, the first offset value Voffset 1 and the second offset value Voffset 2 are not absolute offset values set for the PAs 201 and 202, but indicate differences from initial offset values. The initial offset values indicate offset values which are adjusted such that a relationship between an output of the signal generation section 111 and an output Vout of the PA 202 becomes as linear as possible at a particular temperature. It is assumed in this example that the initial offset values are adjusted such that the relationship between the output of the signal generation section 111 and the output Vout of the PA 202 becomes as linear as possible when the temperature of the PAs 201 and 202 is 25 deg C.

The control section 113 may not necessarily read the first offset value Voffset 1 and the second offset value Voffset 2 from the lookup table 114. The control section 113 may calculate the first offset value Voffset 1 and the second offset value Voffset 2 by using a mathematical function which associates the temperature information T measured by the temperature measuring section 21 with the first offset value Voffset 1 and the second offset value Voffset 2. In other words, the control section 113 can calculate the first offset value Voffset 1 and the second offset value Voffset 2 by using a predetermined functional equation. For example, by using equations (3) and (4) below, the control section 113 calculates the first offset value Voffset 1 and the second offset value Voffset 2 in accordance with the temperature information T measured by the temperature measuring section 21. Here, in the equations (3) and (4), most appropriate values which are calculated in advance are set as coefficients a1 and b1. For example, 0.6 mV/deg C. is set as the coefficient a1, and 0.1 mV/deg C. is set as the coefficient b1. Note that, the coefficients a1 and b1 may be stored in the lookup table 114 (see FIG. 2B).

$$\text{Voffset } 1 = a1 \times T \quad \text{(equation 3)}$$

$$\text{Voffset } 2 = a1 \times T + b1 \times T = \text{Voffset } 1 + b1 \times T \quad \text{(equation 4)}$$

Further, in the case where an output power of the PA 202 is changed in accordance with an output power of the power adjusting section 22 (i.e., in accordance with a power of the phase-modulated signal PM to be inputted to the PA 201), the control section 113 may change the coefficients a1 and b1 in accordance with the output power of the power adjusting section 22. As a specific example, in the case where the output power of the power adjusting section 22 is no lower than −10 dBm (i.e., output power ≧−10 dBm), the control section 113 calculates the first offset value Voffset 1 and the second offset value Voffset 2 by using the above equations (3) and (4). Also, in the case where the output power of the power adjusting section 22 is no greater than −11 dBm (i.e., output power≦−11 dBm), the control section 113 calculates the first offset value Voffset 1 and the second offset value Voffset 2 by using equations (5) and (6) below. Here, most appropriate values which are calculated in advance are set as coefficients a1, a2, b1 and b2. For example, 0.6 mV/deg C. is set as the coefficient a1, and 0.1 mV/deg C. is set as the coefficient b1. Also, 0.7 mV/deg C. is set as the coefficient a2, and 0.0 mV/deg C. is set as the coefficient b2.

Note that, the coefficients a1, a2, b1 and b2 may be stored in the lookup table 114 (see FIG. 2C).

$$\text{Voffset } 1 = a2 \times T \quad \text{(equation 5)}$$

$$\text{Voffset2} = a2 \times T + b2 \times T = \text{Voffset } 1 + b2 \times T \quad \text{(equation 6)}$$

By changing the coefficients a1 and b1 in accordance with the output power of the PA 202, the control section 113 can calculate an optimal first offset value Voffset 1 to be provided to the PA 201 and an optimal second offset value Voffset 2 to be provided to the PA 202 even in the case where input/output characteristics of the PAs 201 and 202 vary in accordance with the output power of the PA 202.

Note that, although a polynomial function of degree one of the temperature information T is used in the equations (3) to (6), a polynomial function of degree n (n is an arbitrary natural number) may be used to calculate the first offset value Voffset 1 and the second offset value Voffset 2. In the equations (3) to (6), the first offset value Voffset 1 is represented by a monomial, and the second offset value Voffset 2 is represented by a polynomial consisting of two terms. However, these values may be each represented by a polynomial consisting of an arbitrary number of terms.

Further, in accordance with a predetermined condition, the control section 113 may switch a manner of obtaining the first offset value Voffset 1 and the second offset value Voffset 2, between reading the first offset value Voffset 1 and the second offset value Voffset 2 from the lookup table 114, and calculating the first offset value Voffset 1 and the second offset value Voffset 2 by using a predetermined functional equation. In other words, the control section 113 can obtain the first offset value Voffset 1 and the second offset value Voffset 2 by reading the lookup table 114 for a particular region, and by performing calculation using functional equations as shown in the equations (3) to (6) for a different region. For example, in the case where the output power of the power adjusting section 22 is no lower than −10 dBm (i.e., output power≧−10 dBm), the control section 113 obtains the first offset value Voffset 1 and the second offset value Voffset 2 by reading the lookup table 114. Also, in the case where the output power of the power adjusting section 22 is no greater than −11 dBm (i.e., output power≦−11 dBm), the control section 113 calculates the first offset value Voffset 1 and the second offset value Voffset 2 by using the above equations (5) and (6).

The first offset value Voffset 1 is inputted to the adder 16 via the OFDAC 14. The second offset value Voffset 2 is inputted to the adder 17 via the OFDAC 15. The amplitude signal M outputted from the digital block 11 is inputted to each of the adders 16 and 17 via the DAC 12. The adder 16 outputs, to the regulator 18, an amplitude signal M1 resulting from adding the first offset value Voffset 1 to the amplitude signal M. The adder 17 outputs, to the regulator 19, an amplitude signal M2 resulting from adding the second offset value Voffset 2 to the amplitude signal M.

The regulator 18 supplies, to the PA 201, a voltage Vcc1 which is controlled in accordance with the amplitude signal M1 outputted from the adder 16. Typically, the regulator 18 supplies, to the PA 201, the voltage Vcc1 proportional to a magnitude of the amplitude signal M1 inputted to the regulator 18. The regulator 19 supplies, to the PA 202, a voltage Vcc2 which is controlled in accordance with the amplitude signal M2 outputted from the adder 17. Typically, the regulator 19 supplies, tot the PA 202, the voltage Vcc2 proportional to a magnitude of the amplitude signal M2 inputted to the regulator 19. Note that, switching regulators, series regulators or the like are used for the regulators 18 and 19.

The phase signal P outputted from the digital block 11 is inputted to the phase modulator 13. The phase modulator 13 phase-modulates the phase signal P, thereby outputting a phase-modulated signal PM. The power adjusting section 22 amplifies or attenuates the phase-modulated signal PM outputted from the phase modulator 13. The PA 201 amplifies, using the voltage Vcc1 supplied from the regulator 18, the phase-modulated signal PM inputted to the PA 201 via the power adjusting section 22. The PA 202 amplifies, using the voltage Vcc2 supplied from the regulator 19, the signal amplified by the PA 201. The signal amplified by the PA 202 is outputted from an output terminal as a transmission signal. Here, an output voltage of the PA 202 is referred to as Vout.

Figure 3A:
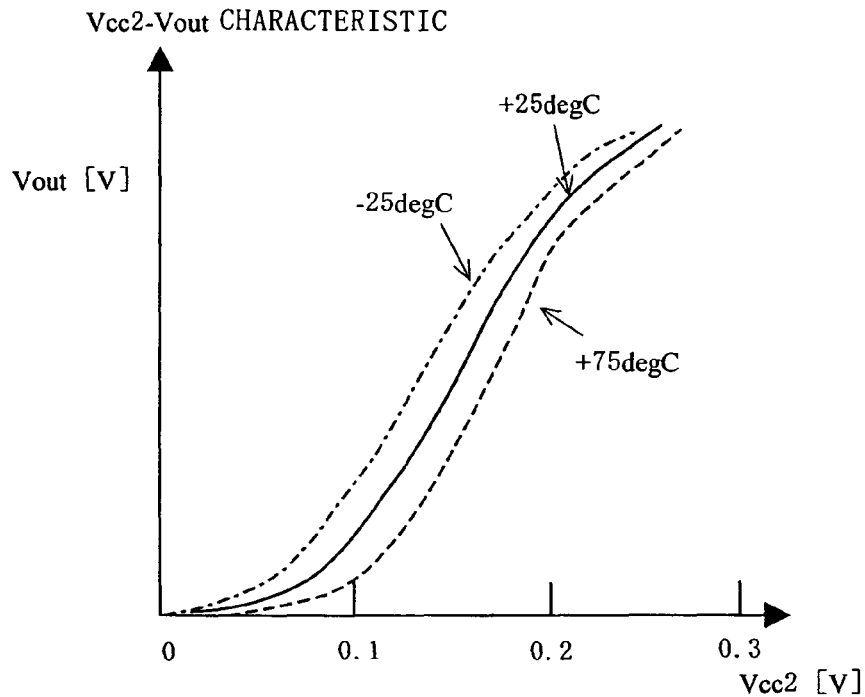
FIG. 3A shows an example of a Vcc2/Vout characteristic in the case of Voffset 1=Voffset 2.
Figure 3B:
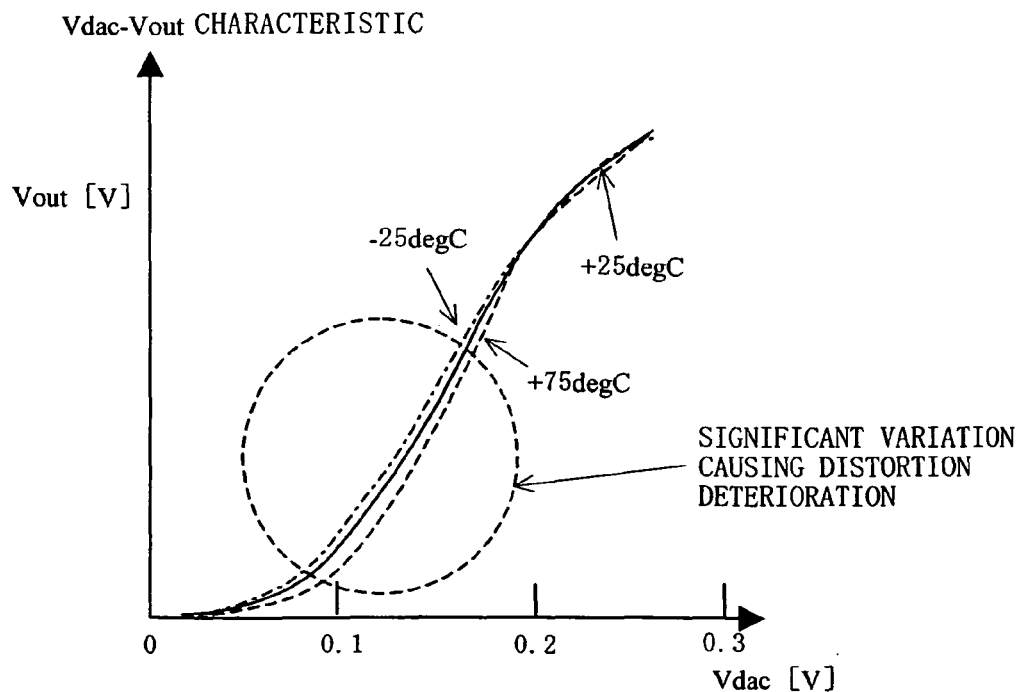
FIG. 3B shows an example of a Vdac/Vout characteristic in the case of Voffset 1=Voffset 2.
Figure 3C:
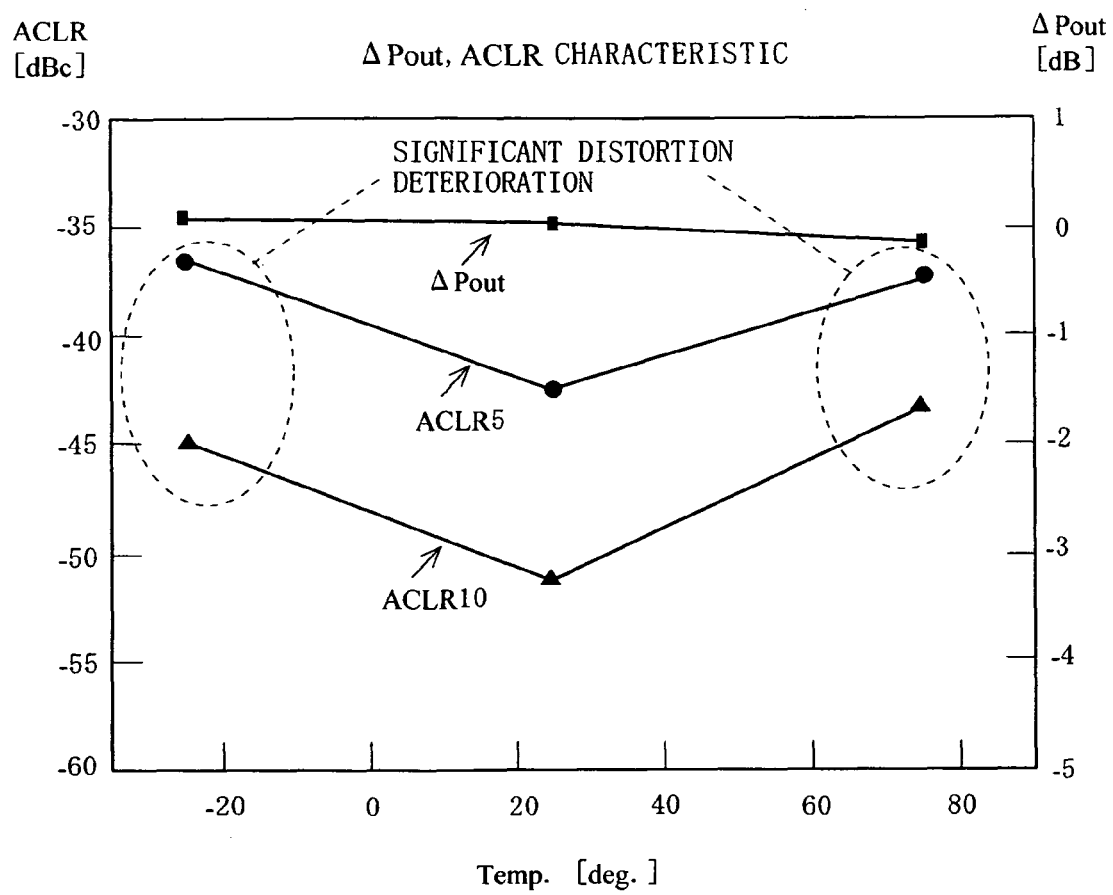
FIG. 3C shows an example of a ΔPout characteristic and ACLR characteristic in the case of Voffset 1=Voffset 2.

Next, an effect of the transmission circuit 1 according to the first embodiment of the present invention will be described. FIGS. 3A to 3C show output characteristics of the transmission circuit 1 in the case where the first offset value Voffset 1 and the second offset value Voffset 2 are controlled using a same value. Here, it is set in FIGS. 3A to 3C that when the temperature of the PAs 201 and 202 is 25 deg C., Voffset 1=Voffset 2=+0 mV. Also, it is set that when the temperature of the PAs 201 and 202 is 75 deg C., Voffset 1=Voffset 2=+30 mV (+0+30 mV). Further, it is set that when the temperature of the PAs 201 and 202 is −25 deg C., Voffset 1=Voffset 2=−30 mV (+0-30 mV).

Figure 4A:
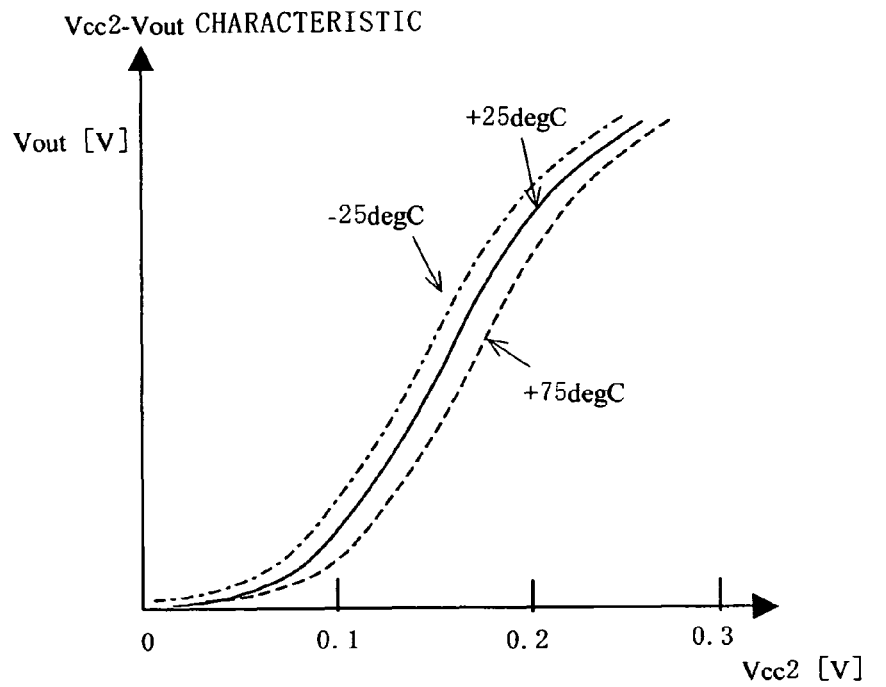
FIG. 4A shows an example of the Vcc2/Vout characteristic in the case where Voffset 1 and Voffset 2 are separately controlled.
Figure 4B:
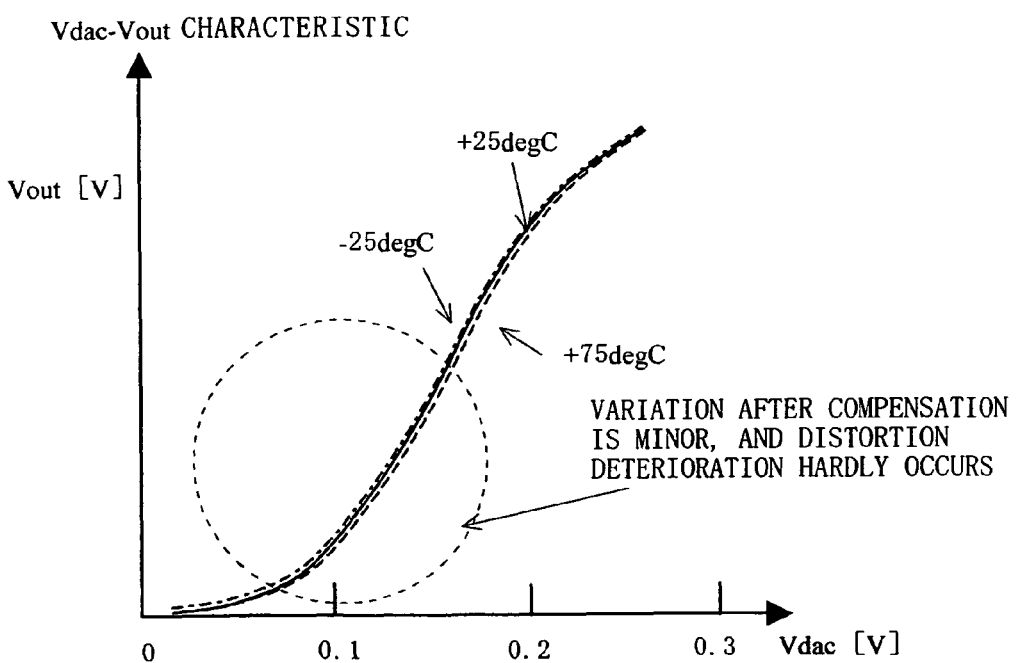
FIG. 4B shows an example of the Vdac/Vout characteristic in the case where Voffset 1 and Voffset 2 are separately controlled.
Figure 4C:
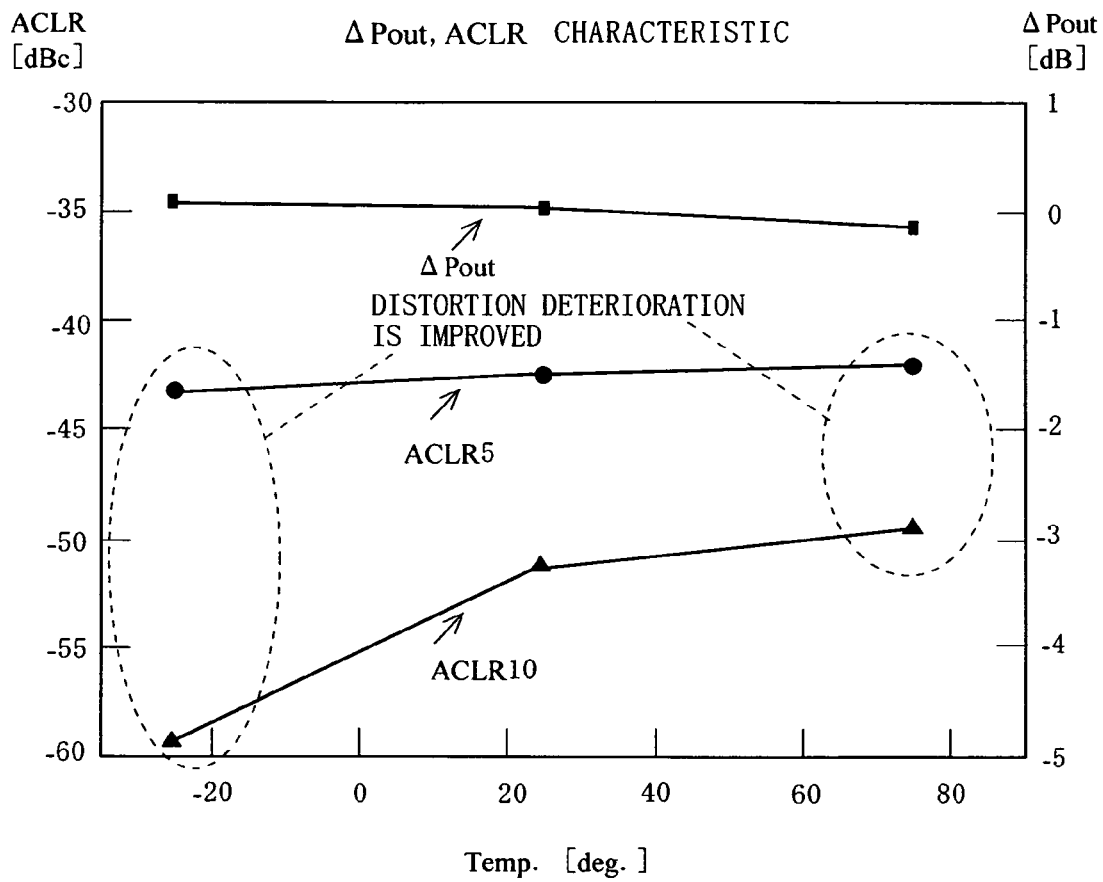
FIG. 4C shows an example of the ΔPout characteristic and the ACLR characteristics in the case where Voffset 1 and Voffset 2 are separately controlled.

FIGS. 4A to 4C show the output characteristics of the transmission circuit 1 in the case where the first offset value Voffset 1 and the second offset value Voffset 2 are separately controlled. Here, it is set in FIGS. 4A to 4C that when the temperature of the PAs 201 and 202 is 25 deg C., Voffset 1=Voffset 2=+0 mV. Also, it is set that when the temperature of the PAs 201 and 202 is 75 deg C., Voffset 1=+35 mV (+0+35 mV), and Voffset 2=+30 mV (+0+30 mV). Further, it is set that when the temperature of the PAs 201 and 202 is −25 deg C., Voffset 1=−35 mV (+0-35 mV) and Voffset 2=−30 mV (+0-30 mV).

FIGS. 3A and 4A each show a Vcc2/Vout characteristic; FIGS. 3B and 4B each show a Vdac/Vout characteristic; and FIGS. 3C and 4C each show a ΔPout characteristic and ACLR characteristics. Here, an output voltage of the DAC 12 is referred to as DAC output Vdac, and a change in the output power of the PA 202 is referred to as ΔPout.

In the case where the first offset value Voffset 1 and the second offset value Voffset 2 are controlled by the same value, the output characteristics of the transmission circuit 1 are such that there exist such regions as encompassed by dotted lines in FIGS. 3B and 3C where distortion deterioration in an output power of the transmission circuit 1 is great although the output power is adjusted when the temperature of the PAs 201 and 202 changes. On the other hand, in the case where the first offset value Voffset 1 and the second offset value Voffset 2 are separately controlled, the output characteristics of the transmission circuit 1 are such that, as shown in FIGS. 4B and 4C, the output power of the transmission circuit 1 is adjusted when the temperature of the PAs 201 and 202 changes, and also, the distortion deterioration in the output power is reduced.

As described above, the transmission circuit 1 according to the first embodiment of the present invention compensates for, at the same time, an offset voltage and a sensitivity characteristic of the amplifying circuit 20 including the PAs 201 and 202, by separately controlling a value of the first offset value Voffset 1 to be provided to the PA 201 and a value of the second offset value Voffset 2 to be provided to the PA 202.

Figure 5:
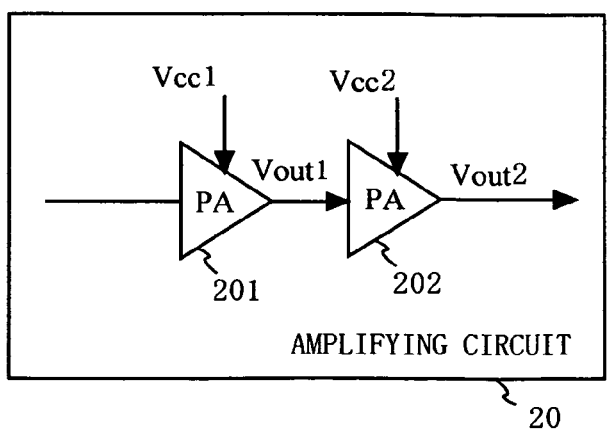
FIG. 5 is a block diagram showing in detail a relationship between an input and an output of an amplifying circuit 20.
Figure 6:
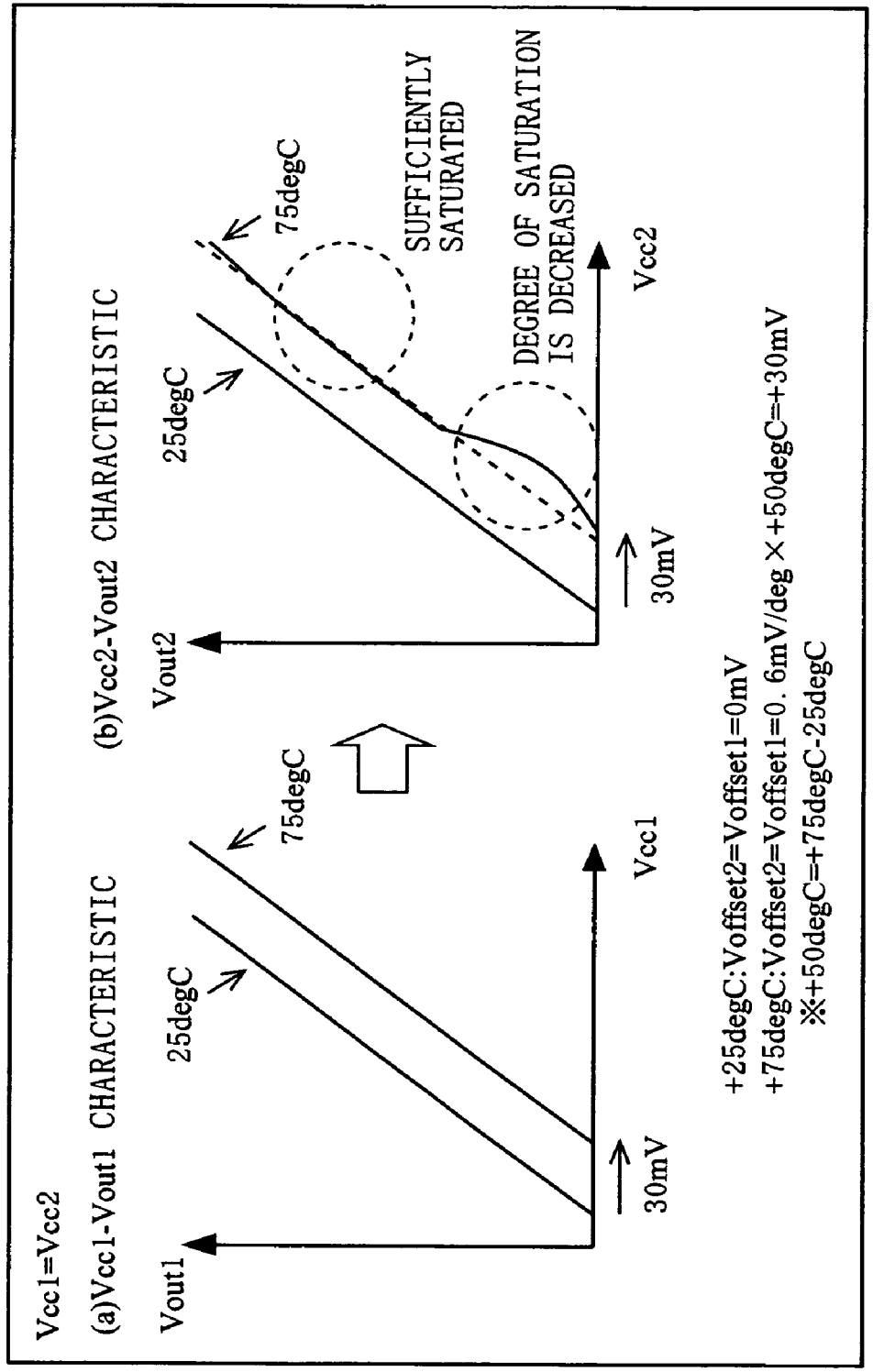
FIG. 6 shows a Vcc1/Vout1 characteristic (a) and a Vcc2/Vout2 characteristic (b) in the case of Vcc1=Vcc2.
Figure 7:
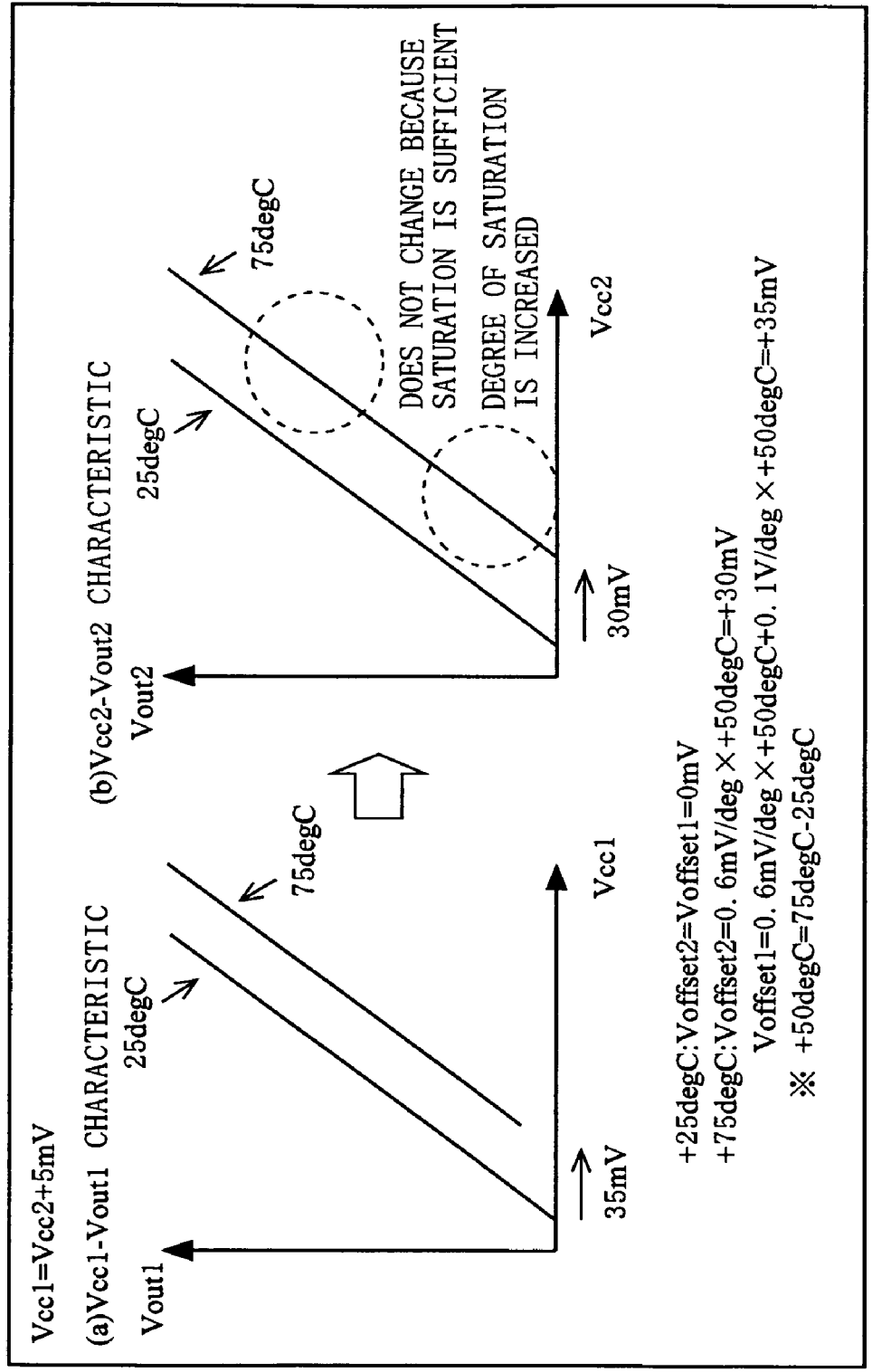
FIG. 7 shows the Vcc1/Vout1 characteristic (a) and the Vcc2/Vout2 characteristic (b) in the case of Vcc1=Vcc2+20 mV.
Figure 10:
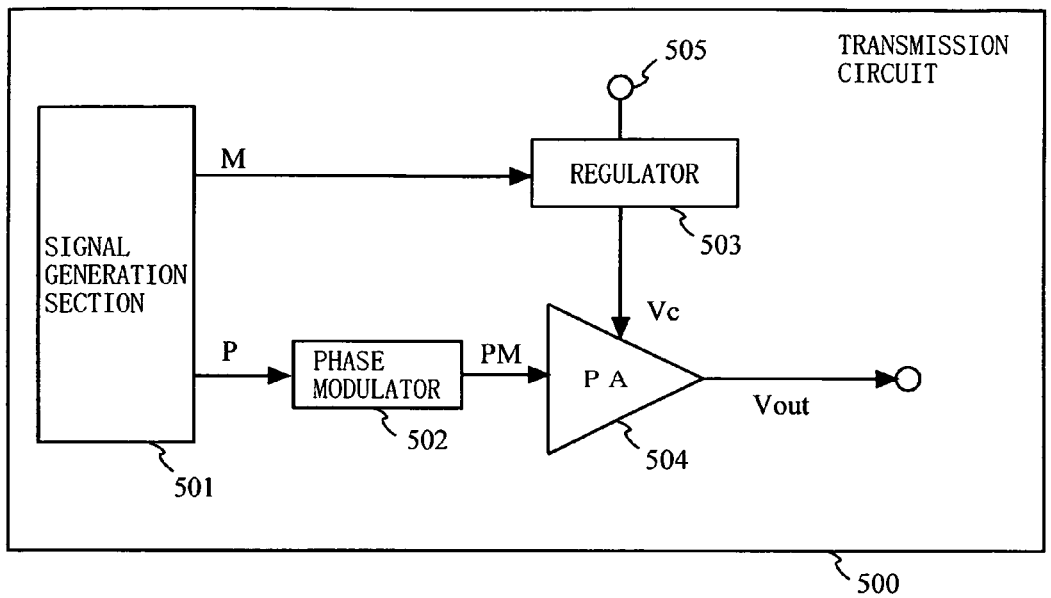
FIG. 10 is a block diagram showing an exemplary structure of a conventional transmission circuit 500.
Figure 11:
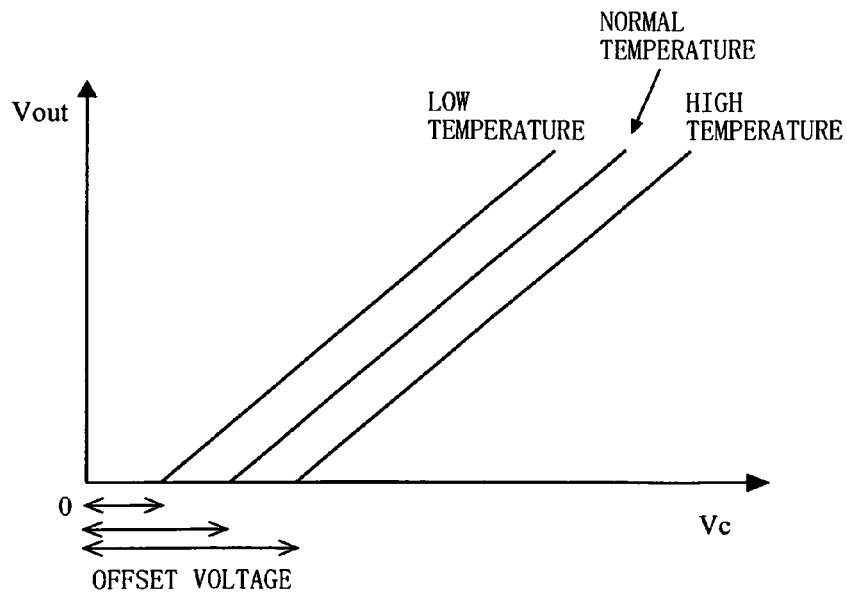
FIG. 11 shows an example of a variation in an offset characteristic of a PA 504, the variation corresponding to a temperature of the PA 504.
Figure 12:
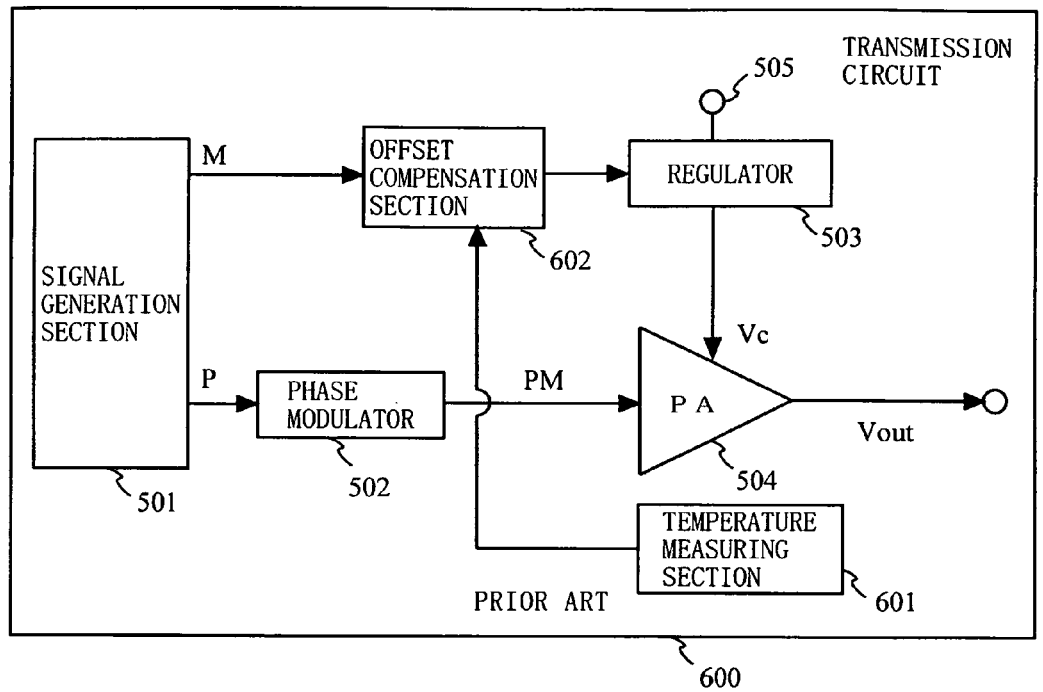
FIG. 12 is a block diagram showing an exemplary structure of a conventional transmission circuit 600.
Figure 13:
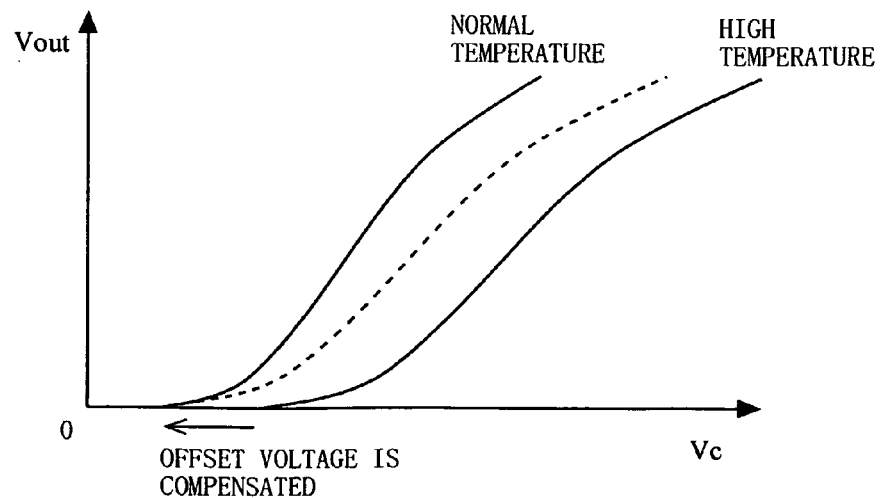
FIG. 13 shows an example of a variation in a sensitivity characteristic of a PA 504, the variation corresponding to a temperature of the PA 504.

Described next is a reason for being able to compensate for the offset voltage and the sensitivity characteristic of the amplifying circuit 20 at the same time by separately controlling the first offset value Voffset 1 to be provided to the PA 201 and the second offset value Voffset 2 to be provided to the PA 202. FIG. 5 is a block diagram showing in detail a relationship between an input and an output of the amplifying circuit 20. FIG. 6 shows a Vcc1/Vout1 characteristic (a) and a Vcc2/Vout2 characteristic (b) in the case where the first offset value Voffset 1 and the second offset value Voffset 2 are controlled using a same value (i.e., Vcc1=Vcc2). FIG. 7 shows the Vcc1/Vout1 characteristic (a) and the Vcc2/Vout2 characteristic (b) in the case where the first offset value Voffset 1 and the second offset value Voffset 2 are separately controlled (i.e., Vcc1=Vcc2+5 mV).

As shown in FIG. 6, when Vcc1=Vcc2, there may be a case where a degree of saturation, in a low-Vcc region of the PA 202 provided at a subsequent stage to the PA 201, decreases due to a rise in the temperature (25 deg C.→75 deg C.) of the PAs 201 and 202. However, as shown in FIG. 7, there is a case where the degree of saturation in the low-Vcc region of the PA 202 at the subsequent stage can be improved by enlarging, in accordance with the rise in the temperature (25 deg C.→75 deg C.) of the PAs 201 and 202, the Vcc1 so as to be greater than Vcc2. In other words, the transmission circuit 1 can compensate for the offset voltage and the sensitivity characteristic of the amplifying circuit 20 at the same time, by separately controlling the first offset value Voffset 1 and the second offset value Voffset 2 and improving the degree of saturation in the low-Vcc region of the PA 202 provided at the subsequent stage.

As described above, according to the transmission circuit 1 of the first embodiment of the present invention, the offset voltage and the sensitivity characteristic of the amplifying circuit 20 including the PAs 201 and 202 can be compensated for by separately controlling the first offset value Voffset 1 to be provided to the PA 201 and the second offset value Voffset 2 to be provided to the PA 202. This allows the transmission circuit 1 to operate with low distortion and high efficiency.

Note that, in the above description, the transmission circuit 1 according to the first embodiment comprises two OFDACs 14 and 15, two adders 16 and 17, two regulators 18 and 19, and two PAs 201 and 202. However, the transmission circuit 1 may comprise three or more of these components. Even in such a case, by separately controlling each of the offset values to be provided to the three or more PAs, the transmission circuit 1 can compensate for the offset voltage and the sensitivity characteristic of the amplifying circuit 20 including the three or more PAs.

Further, the transmission circuit 1 according to the first embodiment of the present invention may be structured similarly to, e.g., a transmission circuit 1a shown in FIG. 8. FIG. 8 is a block diagram showing an exemplary structure of the transmission circuit 1a according to the first embodiment of the present invention. As shown in FIG. 8, the transmission circuit 1a further comprises a DAC 23 between a digital block 11a and the adder 16, as compared to the transmission circuit 1. In this case, an amplitude signal outputted from the digital block 11a is inputted to the adder 16 via the DAC 23, and to the adder 17 via the DAC 12. The transmission circuit 1a produces the same effect as that of the transmission circuit 1.

Second Embodiment

FIG. 9 is a block diagram showing an exemplary structure of a communication device according to a second embodiment of the present invention. As shown in FIG. 9, a communication device 200 according to the second embodiment comprises a transmission circuit 210, reception circuit 220, antenna duplexer 230 and an antenna 240. The transmission circuit 210 is the transmission circuit described in the above first embodiment. The antenna duplexer 230 transmits to the antenna 240 a transmission signal outputted from the transmission circuit 210, and prevents the transmission signal from leaking to the reception circuit 220. Also, the antenna duplexer 230 transmits to the reception circuit 220 a reception signal inputted from the antenna 240, and prevents the reception signal from leaking to the transmission circuit 210.

Accordingly, the transmission signal is outputted from the transmission circuit 210, and released from the antenna 240 to the exterior space via the antenna duplexer 230. The reception signal is received by the antenna 240, and then received by the reception circuit 220 via the antenna duplexer 230. The communication device 200 according to the second embodiment uses the transmission circuit according to the first embodiment, thereby securing the linearity of the transmission signal and also realizing low distortion as a radio device. Since there is no branching element, such as a directional coupler, on an output of the transmission circuit 210, loss from the transmission circuit 210 to the antenna 240 is reduced, whereby power consumption at the time of transmission is reduced. As a result, the communication device 200 is capable of operating for a long period of time as a radio communication device. Note that, the communication device 200 may have a structure which includes only the transmission circuit 210 and antenna 240.

The transmission circuits according to the present invention are applicable to, e.g., communication devices such as mobile phones and wireless LAN devices.

While the invention has been described in detail, the foregoing description is in all aspects illustrative and not restrictive. It is understood that numerous other modifications and variations can be devised without departing from the scope of the invention.

What is claimed is:

1. A transmission circuit comprising an amplifying circuit including a plurality of power amplifiers, wherein
the plurality of power amplifiers includes at least a first power amplifier and a second power amplifier, the transmission circuit comprising:
a digital block for generating an amplitude signal and a phase signal, and outputting a first offset value and a second offset value for compensating for offset characteristics of the first and second power amplifiers;
a DAC block for converting the amplitude signal into an analogue signal and outputting the analogue signal to the first path and to the second path, and converting the first and second offset values to analogue signals and outputting the analogue signals to the first and second paths, respectively;
a first adder for adding the first offset value to the amplitude signal outputted to the first path, and outputting a resultant amplitude signal;
a second adder for adding the second offset value to the amplitude signal outputted to the second path, and outputting a resultant amplitude signal;
a phase modulator for phase-modulating the phase signal, thereby outputting a phase-modulated signal;
a power adjusting section for amplifying or attenuating the phase-modulated signal outputted from the phase modulator;
the first power amplifier for amplifying the phase-modulated signal outputted from the power adjusting section;
the second power amplifier for amplifying an output signal of the first power amplifier;
a first regulator for supplying, to the first power amplifier, a voltage which is controlled in accordance with the amplitude signal outputted from the first adder;
a second regulator for supplying, to the second power amplifier, a voltage which is controlled in accordance with the amplitude signal outputted from the second adder; and
a temperature measuring section for measuring a temperature of the amplifying circuit as temperature information, wherein the digital block separately controls the first offset value and the second offset value in accordance with the temperature information measured by the temperature measuring section.

2. The transmission circuit according to claim 1, wherein the digital block includes:
   a signal generation section for generating the amplitude signal and the phase signal;
   a distortion compensation section for compensating for distortion of the amplitude signal and the phase signal;
   a lookup table in which the first offset value and the second offset value are stored; and
   a control section for reading the first offset value and the second offset value from the lookup table in accordance with the temperature information measured by the temperature measuring section.

3. The transmission circuit according to claim 1, wherein the digital block includes:
   a signal generation section for generating the amplitude signal and the phase signal;
   a distortion compensation section for compensating for distortion of the amplitude signal and the phase signal; and
   a control section for calculating the first offset value and the second offset value by using a mathematical function which associates the temperature information measured by the temperature measuring section with the first offset value and the second offset value.

4. The transmission circuit according to claim 3, wherein the control section calculates, as the first offset value, a product obtained by multiplying the temperature information measured by the temperature measuring section by a first coefficient, and calculates, as the second offset value, a sum of the first offset value and a product obtained by multiplying the temperature information measured by the temperature measuring section by a second coefficient.

5. The transmission circuit according to claim 4, wherein the control section changes the first coefficient and the second coefficient in accordance with an output power of the second power amplifier.

6. The transmission circuit according to claim 1, wherein the DAC block includes:
   a DA converter for converting the amplitude signal, which is outputted from the digital block, into an analogue signal, and outputting the analogue signal to the first path and to the second path;
   a first offset DA converter for converting the first offset value, which is outputted from the digital block, into an analogue signal, and outputting the analogue signal to the first path; and
   a second offset DA converter for converting the second offset value, which is outputted from the digital block, into an analogue signal, and outputting the analogue signal to the second path.

7. The transmission circuit according to claim 1, wherein the DAC block includes:
   a first DA converter for converting the amplitude signal, which is outputted from the digital block, into an analogue signal, and outputting the analogue signal to the first path;
   a second DA converter for converting the amplitude signal, which is outputted from the digital block, into an analogue signal, and outputting the analogue signal to the second path;
   a first offset DA converter for converting the first offset value, which is outputted from the digital block, into an analogue signal, and outputting the analogue signal to the first path; and
   a second offset DA converter for converting the second offset value, which is outputted from the digital block, into an analogue signal, and outputting the analogue signal to the second path.

8. A communication device comprising:
   a transmission circuit for generating a transmission signal; and
   an antenna for outputting the transmission signal generated by the transmission circuit, wherein
   the transmission circuit is the transmission circuit according to claim 1.

9. The communication device according to claim 8, further comprising:
   a reception circuit for processing a reception signal received from the antenna; and
   an antenna duplexer for outputting the transmission signal generated by the transmission circuit to the antenna, and outputting the reception signal received from the antenna to the reception circuit.

* * * * *